(12) United States Patent
Yang et al.

(10) Patent No.: US 7,033,518 B2
(45) Date of Patent: Apr. 25, 2006

(54) METHOD AND SYSTEM FOR PROCESSING MULTI-LAYER FILMS

(75) Inventors: Hui Ou Yang, Hsinchu (TW); Miao-Ju Hsu, Bei-Kong (TW); Chao-Cheng Chen, Shin-Chu County (TW); Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 164 days.

(21) Appl. No.: 10/602,968

(22) Filed: Jun. 24, 2003

(65) Prior Publication Data

US 2004/0262260 A1 Dec. 30, 2004

(51) Int. Cl.
*H01L 21/00* (2006.01)
(52) U.S. Cl. .............................. 216/60; 216/59; 438/14; 438/16
(58) Field of Classification Search ................. 216/59, 216/60; 156/345.24; 438/14, 16

See application file for complete search history.

(56) References Cited

U.S. PATENT DOCUMENTS 6,300,251 B1 * 10/2001 Pradeep et al. .............. 438/710
6,498,045 B1 * 12/2002 Gu ................................. 438/9
6,712,927 B1 * 3/2004 Grimbergen et al. ... 156/345.24
6,755,932 B1 * 6/2004 Masuda et al. ........ 156/345.24

* cited by examiner

*Primary Examiner*—Shamim Ahmed
(74) *Attorney, Agent, or Firm*—Slater & Matsil, L.L.P.

(57) ABSTRACT

A method of etching multi-layer films, the method including: (1) etching a plurality of layers according to etching parameters, (2) determining a plurality of optical characteristics each associated with one of the plurality of layers and determined during the etching of the associated one of the plurality of layers, and (3) determining dynamic etch progressions each based on one of the plurality of optical characteristics that is associated with a particular one of the plurality of layers undergoing the etching.

11 Claims, 6 Drawing Sheets

METHOD AND SYSTEM FOR PROCESSING MULTI-LAYER FILMS

TECHNICAL FIELD OF THE INVENTION

The present invention is directed, in general, to manufacturing microelectronic devices and, more specifically, to methods and systems for manufacturing microelectronic devices having multi-layer films.

BACKGROUND OF THE INVENTION

A large variety of "thin films" are used in the fabrication of microelectronic devices. For example, these films may be thermally grown or deposited from a vapor phase and may include metals, semiconductors or insulators. Due to the extremely fine patterns and dimensions of features that are formed in a microelectronic device, the thickness of the films and the depth of the patterns etched therein are significant factors in achieving acceptable product yield.

Uniformity of thin film thickness and precise etching depth control are particularly critical in etching processes. Previously, film thickness and feature depth were determined ex-situ after the etching processes by optical measurement before and after plasma processing of known duration. This process was not suitable as a diagnostic tool for real-time process control, i.e., in-situ monitoring and control of the etching process.

Accordingly, a number of in-situ techniques now exist to measure etching depth and/or film thickness. One such technique, optical emission interferometry, analyzes the interference of light reflected from a thin film being etched or deposited. Generally, monitoring film thickness or determining an etch depth progression by interferometry involves selecting a wavelength $\lambda$ for irradiation incident on a layer to be etched, measuring an index of refraction n of the layer, and collecting optical signals reflected from irradiation incident on the layer. The optical signals are then analyzed to separate the frequency f of the layer being etched. A wave number N may then be determined by the equation:

$$N = f * \Delta t; \qquad (1)$$

where $\Delta t$ is a predetermined time interval, such as a simulated etching processing time interval. Assuming the incidence of the irradiation is substantially normal to the surface of the layer being etched, the etch depth D may be subsequently determined by the equation:

$$D = N * \lambda / (2 * n). \qquad (2)$$

Those skilled in the art will recognize that film deposition thickness may be determined in a similar manner.

While this conventional method provides satisfactory prediction of etch depth and deposition thickness, it relies on the assumption that the layer being processed has substantially uniform characteristics, such as a uniform index of refraction (n). However, many layers employed in existing microelectronic devices, such as extremely low-k (ELK) dielectric layers, comprise multiple layers of different materials having different refractive indices and other characteristics. For example, process requirements for managing stress values related to ELK layers while maintaining desired dielectric values may mandate a multi-layer film in which the refractive indices of the individual layers may vary by 25% or more. Thus, it follows from equation (2) above that any inaccuracy of the index of refraction employed to monitor the etch progression can result in a corresponding inaccuracy in the resulting layer thickness or etch depth.

Accordingly, what is needed in the art is a method of manufacturing microelectronic devices having multi-layer films of varying refractive indices or other varying characteristics that addresses the problems discussed above.

SUMMARY OF THE INVENTION

To address the above-discussed deficiencies of the prior art, the present disclosure provides a method of etching a multi-layer film, the method including: (1) etching a plurality of layers according to etching parameters, (2) determining a plurality of optical characteristics each associated with one of the plurality of layers and determined during the etching of the associated one of the plurality of layers, and (3) determining dynamic etch progressions each based on one of the plurality of optical characteristics that is associated with a particular one of the plurality of layers undergoing the etching. The method may be employed to remove portions of the plurality of layers (e.g., patterning) and/or to deposit at least portions of the plurality of layers.

The present disclosure also provides a method of manufacturing a microelectronic device, including: (1) providing a substrate having a first layer located on a surface thereof and a second layer located on the first layer, (2) determining a first etch rate by identifying a first optical characteristic of the first layer by interferometry, (3) etching to a first target etch depth based on the first etch rate, (4) determining a second etch rate by identifying a second optical characteristic of the second layer by interferometry, and (5) etching to a second target etch depth based on the second etch rate. Of course, this method may also be employed with more than two layers.

An embodiment of an etching system is also provided in the present disclosure. The system includes: (1) means for controlling irradiation of an etching section of a target film, the target film including a plurality of layers having varying optical characteristics, (2) means for detecting optical signals reflected from a surface of an exposed one of the plurality of layers in the etching section, (3) means for analyzing the optical signals to determine a frequency of the exposed one of the plurality of layers, and (4) means for detecting a change in the frequency, wherein the controlling means are configured to dynamically adapt to the change to modify parameters of the irradiation.

The foregoing has outlined preferred and alternative features disclosed in the present disclosure so that those skilled in the art may better understand the detailed description that follows. Additional features will be described hereinafter that form the subject of the claims presented herein. Those skilled in the art should appreciate that they can readily use the present disclosure as a basis for designing or modifying other structures or processes for carrying out the same purposes and/or achieving the same advantages described in the present disclosure. Those skilled in the art should also realize that such equivalent constructions or processes do not depart from the spirit and scope of the present disclosure.

BRIEF DESCRIPTION OF THE DRAWINGS

The claims presented herein are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which:

DETAILED DESCRIPTION OF ILLUSTRATIVE EMBODIMENTS

Figure 1:
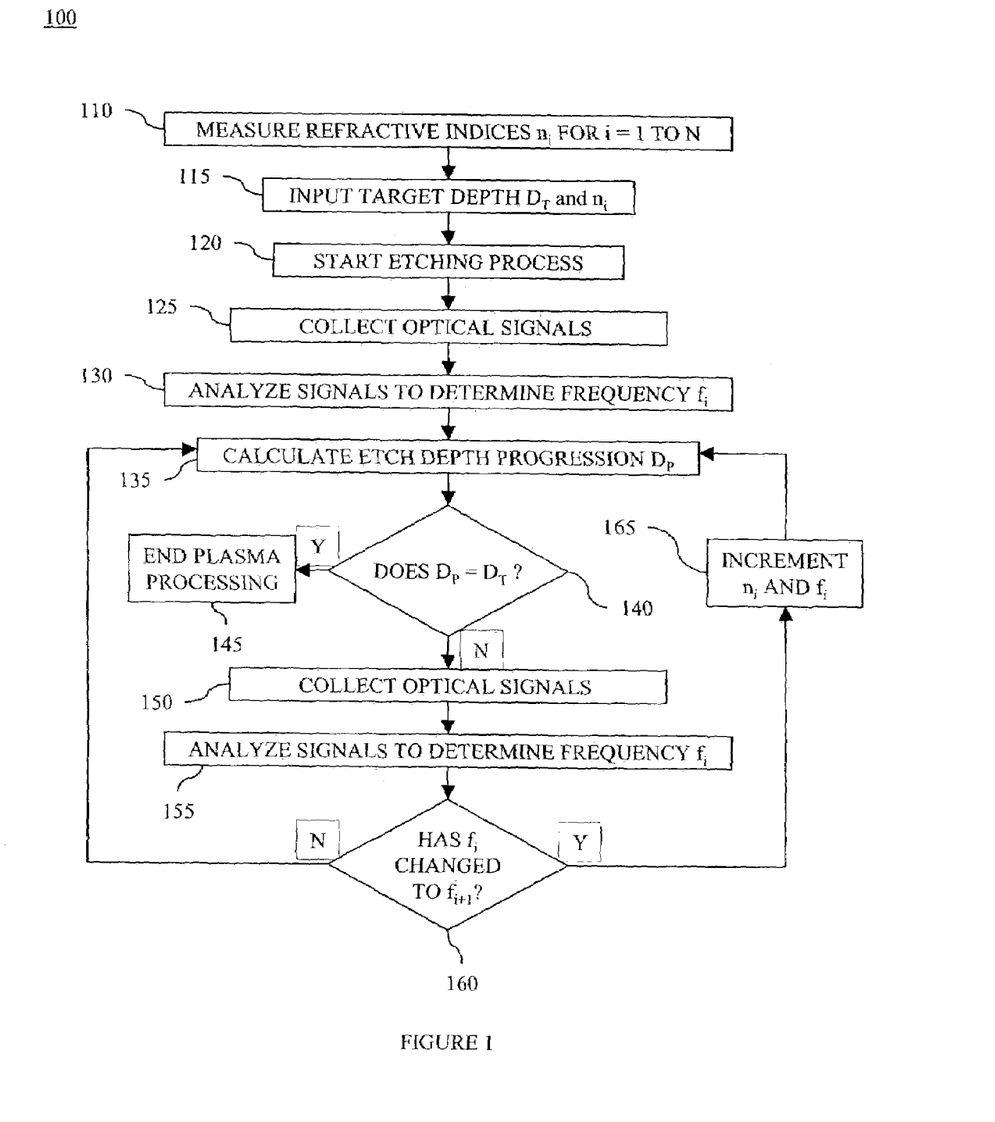
FIG. 1 illustrates a flow-chart diagram of one embodiment of a method of etching a multi-layer film according to the principles of the present disclosure.

Referring initially to FIG. 1, illustrated is a flow-chart diagram representing one embodiment of a method 100 of etching a multi-layer film according to the principles of the present disclosure. The method 100 begins in a step 110 wherein the refractive indices $n_i$ for each of the N layers in the film being etched are measured, for example, by optical inspection devices such as those sold by KLA-Tencor of San Jose, Calif. and Therma-Wave of Fremont, Calif. The refractive indices $n_i$ and a target etch depth $D_T$ are then input into a control algorithm in a next step 115. The refractive index $n_1$ of the first layer to be etched may also be activated for initial use by the control algorithm, such as by adding the refractive index $n_1$ to a register or buffer.

In a subsequent step 120, an etching process is started. In many applications, the etching process may be employed with or through a photoresist or other mask layer, such that the etching process is only effective to areas of etching layers that are exposed through openings in the mask layer. Moreover, as will be described below, many processes may be employed as an etching process within the scope of the present disclosure. For example, the etching process may include dry plasma etching, chemical-vapor-deposition, sputter deposition, thermal deposition, evaporation, physical vapor transport or other conventional or future-developed thin-film processes. The etching process may also include a chemical-mechanical polishing (CMP) process, wherein at least a portion of the substrate being processed and/or the CMP apparatus may include an optical path to the area being etched (or polished) that is optically transparent, at least to the irradiation employed for thickness/depth detection, as described below. Thus, it follows that the etching process initiated in the step 120 may be employed to remove portions of the layers being etched, and may also be employed to form the layers by additive etching (e.g., sputtering). However, in the interest of brevity, portions of the following discussion of the method 100 shown in FIG. 1 may assume the etching process initiated in the step 120 is employed to remove portions of the layers being etched. Of course, such treatment is not intended to limit any aspect of the present disclosure to employing the etching process to remove material rather than to add material.

The method 100 continues in a step 125 wherein optical signals are collected. In one embodiment, the method 100 may be a real-time method, such that the optical signals are continuously collected while the etching process initiated in the step 120 continues. There are many apparatus and processes by which the optical signals may be collected. For example, a charge-coupled device (CCD) camera (such as those available from Electrim of Princeton, N.J.) having a CCD array (such as those available from Texas Instruments of Dallas, Tex.) and an acquisition board may be connected to a data processing apparatus (such as the processor of a personal computer) for receiving reflected signals. The signals may also pass through a focusing lens such that the analyzable area of the wafer being processed may be adjusted.

Irradiation from, for example, energized plasma within the processing chamber may impinge on and be reflected from the upper surface of the first or topmost layer being etched. Because the second layer (under the first layer) has a different index of refraction than the first layer, the incident light is reflected from the interface between the two layers. Such plasma optical emission may consist of light having a wide spectrum of wavelengths, ranging from ultraviolet to near infrared. In one embodiment, the signals collected in the step 125 (and subsequently) may pass through a window or viewing port in the processing chamber, such that the signal collection may be in-situ and real-time.

The signal collection initiated in the step 125 may include collection by interferometry, which can be performed at various wavelengths. Optical emission interferometry may provide more accurate results at shorter wavelengths because the spacing between adjacent maxima and minima corresponds to a smaller film thickness. Thus, an optical band-pass filter may be employed to select the wavelength of the light entering the signal collection device. For example, an optical band-pass filter having a center wavelength of about 250 nm and a full width half maximum of about 200 to 400 nm may be employed. Moreover, multiple wavelengths may be selected, such as by employing mathematics algorithms or multiple band-pass filters.

The collected signals may be transduced by the device(s) employed for signal collection in the step 125 or other apparatus coupled thereto. While the signal collection initiates in the step 125, the signals may be collected and transduced periodically or continuously during the etching process.

The collection of optical signals may be assisted by a beam expander and an auxiliary light source, such as a laser, a mercury pen ray lamp, a xenon arc lamp, a bright white light lamp or another source of intense although not necessarily narrowly focused light, such as if illumination in addition to the plasma is required. In such embodiments, the signal collection device may also include or be coupled to one or more lenses or diffusers. Use of a laser or other light source may improve the ratio of signal strength to noise, and can also allow the use of the methods of the present disclosure with non-plasma etching systems. The light reflected from the surface of the wafer being processed may also be focused into an optical cable or cable bundle by a lens. The signal collection may also include analog-to-digital conversion to assist in the subsequent analysis of the collected signals.

The method 100 then continues in a next step 130 in which the optical signals collected in the step 125 are analyzed to determine optical characteristics of the layer(s) being etched. For example, in embodiments in which the optical signals are interferometry signals, a fringe count analysis may be performed in a time domain and converted into a frequency domain, such as by Fast Fourier Transform or other conventional or future-developed processes. As such, a frequency $f_1$ based on etching time may be determined for the particular layer being etched. Thereafter, the etching rate based on the frequency $f_1$ may be determined by the equation:

$$\text{Etch Rate} = f_1 * \lambda / (2 * n_1); \quad (3)$$

where λ is the wavelength of the light incident on the layer being etched and $n_1$ is the index of refraction of the layer being etched (previously determined in the step 110). Subsequently, the etch depth progression $D_P$ based on the etching time may be determined in a step 135. Of course, the analysis in the step 130 and the determination of the etch depth progression $D_P$ in the step 135 may include other processes or calculations, and other characteristics of the layers being etched may also be determined and employed to determine the etch depth progression $D_P$. Moreover, as with the step 125, the analysis performed in the step 130 may be performed periodically or continuously during the etching process initiated in the step 120, such as if the method 100 is employed as a real-time method of determining the etch depth progression $D_P$.

The method 100 then continues to a decisional step 140, wherein the etch depth progression $D_P$ is compared to the target etch depth $D_T$. If the etch depth progression $D_P$ equals the target etch depth $D_T$, the method 100 proceeds to a step 145 in which the etching process may end. Of course, although not described herein, additional steps may be performed before or after the step 145 within the scope of the present disclosure, such as repeating signal collection and analysis for error detection or validity checking.

If the comparison performed in the decisional step 140 reveals that the etch depth progression $D_P$ has not yet reached the target etch depth $D_T$, the method 100 proceeds by continuing to collect and analyze optical signals in subsequent steps 150 and 155, which may be performed concurrently, while the etching process initiated in the step 120 continues. In a decisional step 160, a change in the frequency $f_i$ of the layer being etched may be detected. That is, if no change in the frequency $f_i$ of the layer being etched is detected, the method returns to the step 135 to re-evaluate the etch depth progression $D_P$ and continue the etching and analysis processes under current parameters.

However, if a change in the frequency $f_i$ of the layer being etched is detected in the decisional step 160, a step 165 increments the frequency $f_i$ to the next frequency $f_{i+1}$ as determined by the analysis in the step 155, and also increments the index of refraction $n_i$ to the next index of refraction $n_{i+1}$, as previously measured in the step 110. This is because a change in the detected frequency from $f_i$ to $f_{i+1}$ indicates that the first layer has been completely etched away and that the underlying layer is now exposed to the incident radiation (thus resulting in the change in the detected frequency). The method may then return to the step 135 to continue etching and monitoring the etch depth progression $D_P$ employing the characteristics of the new layer. The step 165 may also include modifying the parameters of the etching process initiated in the step 120. For example, the change in frequency $f_i$ may also trigger a change in etchant chemistry, RF power, microwave power, chamber pressure, chamber temperature or etching time. This process is continued until the decisional step 140 determines that the target etch depth $D_T$ has been attained. In this manner, the analysis of a particular layer being etched may employ the optical characteristics unique to that layer, such that the processing of that layer may be precisely controlled.

Thus, generally, the present disclosure provides a method of determining an etching or deposition end point that incorporates the different optical characteristics of the individual layers of a multi-layer film being etched into the process parameters. This is advantageous over existing end point detection and other etching/deposition techniques in that more precision may be obtained because etching parameters may be adapted to the particular layer being etched rather than to general or averaged characteristics of the multiple layers in the film.

Turning to FIGS. 2–8, illustrated are sectional views of one embodiment of a method of manufacturing a microelectronic device 200 according to the principles of the present disclosure. The manufacture of the microelectronic device 200 is one environment in which the method 100 shown in FIG. 1 may be employed.

Figure 2:
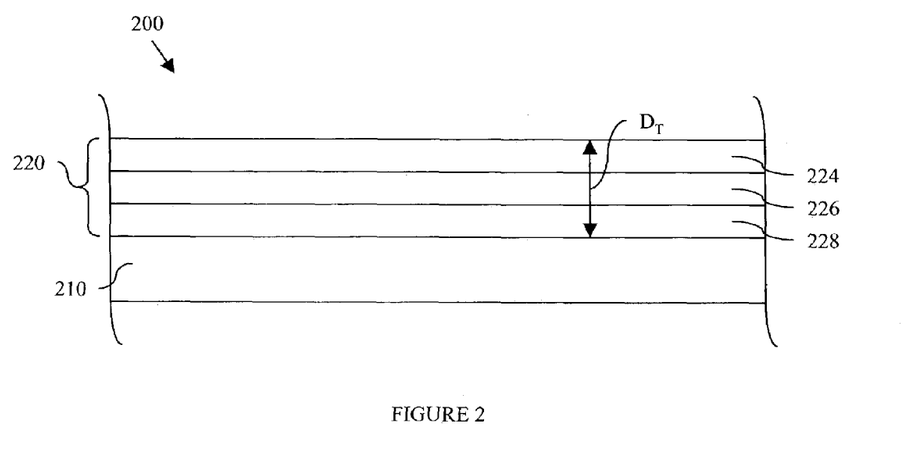
FIGS. 2–8 illustrate sectional views demonstrating one embodiment of a method of manufacturing a microelectronic device according to the principles of the present disclosure.

FIG. 2 illustrates the microelectronic device 200 in an initial stage of manufacture, wherein the microelectronic device 200 includes a substrate 210 and a multi-layer film 220 formed over the substrate 210. In the particular embodiment shown in FIG. 2, the film 220 includes three individual layers 224, 226, and 228, although the film 200 may include any number of layers to be processed by the methods of the present disclosure. The layers 224, 226, and 228 may vary in composition, thickness and various optical characteristics. For example, the refractive indices $n_i$ of the layers 224, 226, and 228 may vary by about 25%, although two or more of the refractive indices $n_i$ or other characteristics of the layers 224, 226, and 228 may also be substantially similar or equal. The layers 224, 226, and 228 may comprise fluorosilicate glass, undoped silicon glass, phosphosilicate glass, silicon nitride or other materials.

It is also intended that a "layer" need not be a discrete feature. That is, a "layer" may be a portion or region of a film layer having different characteristics than other portions of the film. For example, the nitrided region of a gate oxide may constitute a layer, the non-nitrided portions of the gate oxide may constitute another layer, and the entire gate oxide including both the nitrided region and the non-nitrided region may constitute a layer within the scope of the present disclosure.

Those skilled in the art will recognize that there are myriad processes by which the layers 224, 226, and 228 may be formed. Moreover, the layers 224, 226, and 228 may be formed independently or in-situ, wherein at least two of the layers 224, 226, and 228 may be serially formed without removing the substrate 210 from the processing environment (e.g., a plasma chamber). Furthermore, while the description of the methods provided herein discusses etching to remove portions of the layers 224, 226, and 228, those skilled in the art will recognize that the methods herein may also be readily adapted to monitor the thickness of one or more of the layers 224, 226, and 228 during their formation. In the particular embodiment shown in FIGS. 2–7, the etching process is employed to remove portions of the film 220, such as to form a trench or define a gate oxide layer. However, as discussed above, the etching processes of the present disclosure are not limited to such use.

Figure 3:
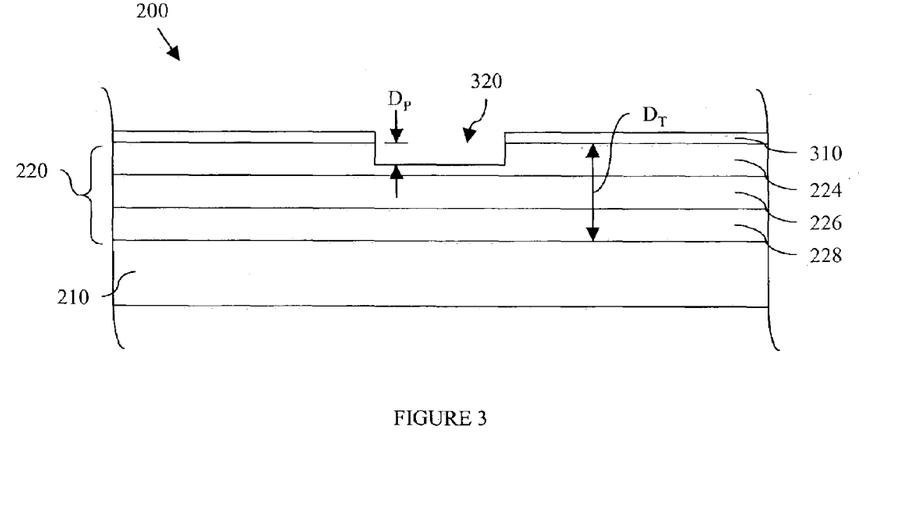

FIG. 3 illustrates a sectional view of the semiconductor device 200 shown in FIG. 2 after undergoing partial etching. As shown in FIG. 3, the film 220 has been partially etched to an etch depth progression $D_P$, which initially extends partially into the first layer 224 of the film 220. A photoresist or other mask layer 310 may be formed over the film 220 prior to initiating the etching process, such that the film 220 may only be processed in an etching section 320. Moreover, those skilled in the art will recognize that the methods disclosed herein may be employed to form damascene features, and may be readily adapted to applications requiring dual-damascene features, although such embodiments may require additional mask layers (not shown).

As described above with reference to FIG. 1, optical signals reflected from the first layer 224 may be collected and analyzed while the first layer 224 is being etched. The analysis of the signals may reveal the frequency $f_1$ or other optical characteristics of the first layer 224 during etching, such that the etching of the layer 224 may be monitored in-situ and real-time. If the etch depth progression $D_P$ does not equal the target etch depth $D_T$, as shown in FIG. 3, the manufacturing method proceeds by continuing to collect and analyze optical signals, which may be performed concurrently, periodically or continuously, while the etching process continues.

Figure 4:
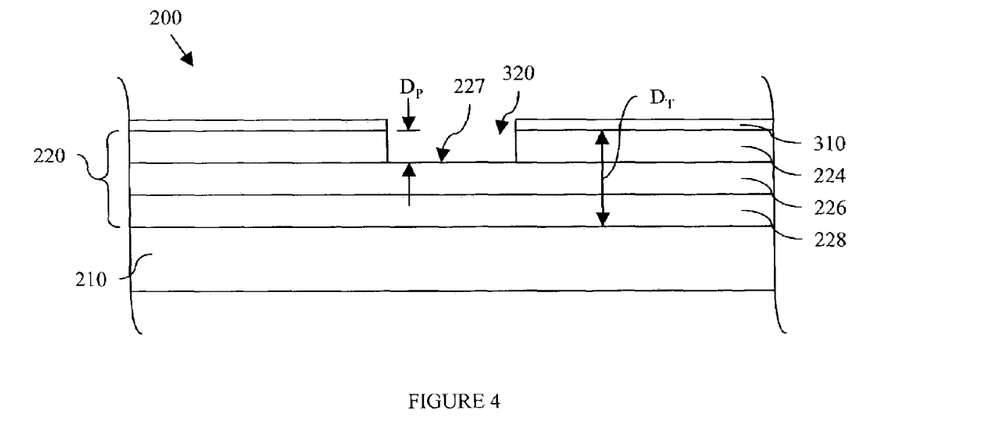

Eventually, a change from the first frequency $f_1$ of the first layer 224 to the second frequency $f_2$ of the second layer 226 will be detected when the etching process progresses through the entire thickness of the first layer 224. For example, FIG. 4 illustrates a sectional view of the microelectronic device 200 shown in FIG. 3 after the etching process exposes a portion 227 of the second layer 226. At this stage in the manufacture of the microelectronic device 200, a control algorithm may increment the frequency $f_1$ of the first layer 224 to the second frequency $f_2$ of the second layer 226. The control algorithm may also increment the first index of refraction $n_1$ of the first layer 224 to the second index of refraction $n_2$ of the second layer 226, as previously measured before the etching process was initiated. In one embodiment, the change in frequency may also trigger the modification of one or more parameters of the etching process, as described above with reference to the method 100 shown in FIG. 1. The manufacture of the microelectronic device 200 then continues to etch the film 220 while periodically or continuously collecting and analyzing optical signals using the new frequency $f_2$ and index of refraction $n_2$. This iterative process is continued until the target etch depth $D_T$ has been attained.

Figure 5:
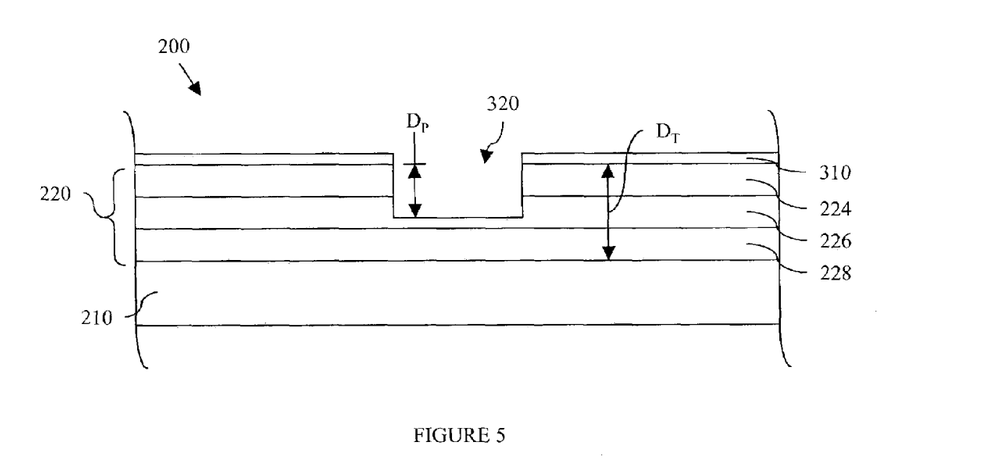
Figure 6:
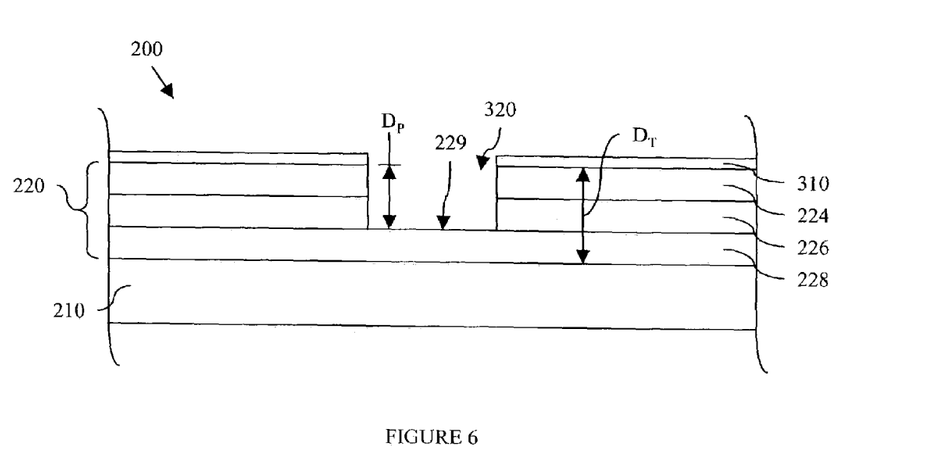
Figure 7:
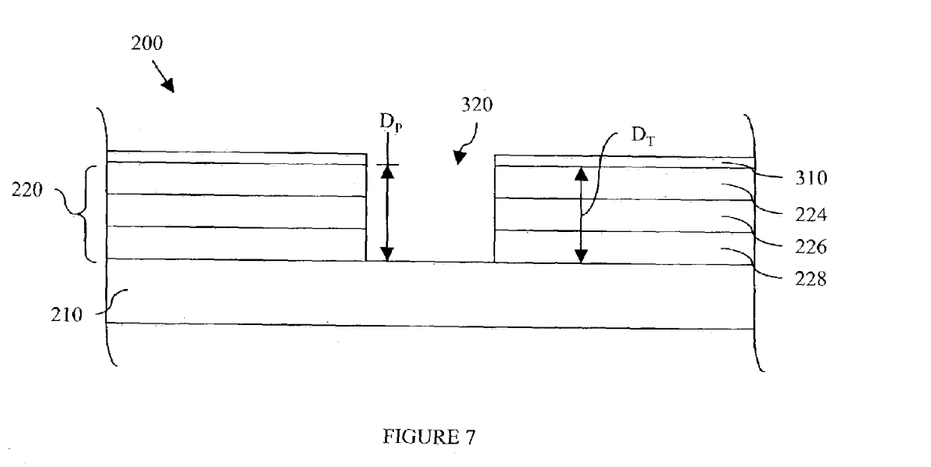

For example, these successive iterative steps are illustrated in FIGS. 5–7. As shown in FIG. 5, which illustrates a sectional view of the microelectronic device 200 shown in FIG. 4 in a subsequent stage of manufacture, the etching process continues along with the collection and analysis of the optical signals reflected from the film 220, such that the etch depth progression $D_P$ may extend partially into the second layer 226. As shown in FIG. 6, which illustrates a sectional view of the microelectronic device 200 shown in FIG. 5 in a subsequent stage of manufacture, the analysis of the reflected optical signals will detect that the second layer 226 has been etched substantially through to expose a portion 229 of the underlying third layer 228. This change may trigger the control algorithm to increment the frequency from $f_2$ to $f_3$ and the index of refraction from $n_2$ to $n_3$. Again, the change may also trigger the modification of the etching parameters, possibly based on the new frequency $f_3$ and/or the new index of refraction $n_3$. This process continues until the target etch depth $D_T$ is attained, as shown in FIG. 7, which illustrates a sectional view of the microelectronic device 200 shown in FIG. 6 in a subsequent stage of manufacture, wherein the etching process may be substantially completed to form an opening or trench.

Figure 8:
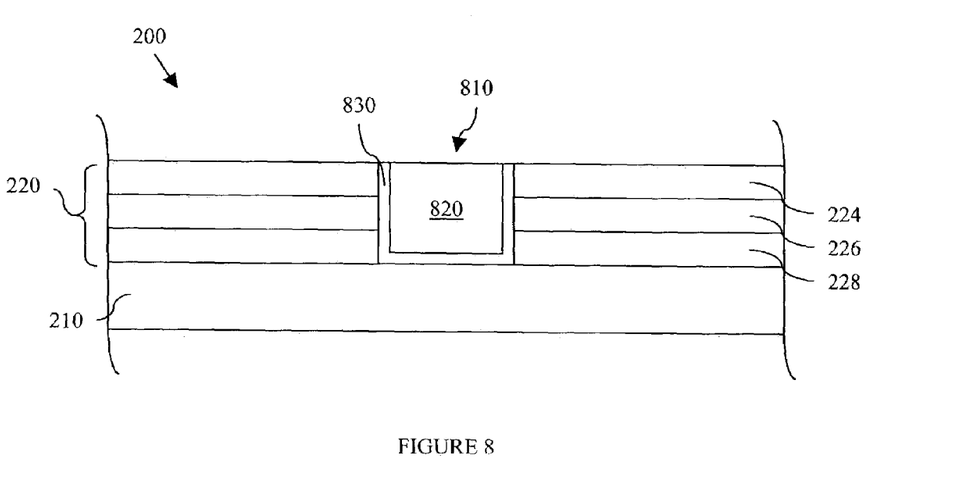

However, the manufacture of the microelectronic device 200 may include additional steps, such as the formation of a metal interconnect in the trench. Such an embodiment is shown in FIG. 8, which illustrates a sectional view of the microelectronic device 200 shown in FIG. 7 in a subsequent and possibly completed stage of manufacture. As shown in FIG. 8, a metal interconnect 810 may be formed by filling the trench with an interconnect metal 820, such as copper, gold or tungsten. However, in many applications, the layers 224, 226, and 228 may comprise silicon oxide or other materials into which copper may readily diffuse. Accordingly, the trench may be lined with a barrier layer 830, such as TiN, to provide a barrier to such diffusion and to improve the adhesion of the interconnect metal 820 to the layers 224, 226, and 228. Of course, while FIGS. 2–8 depict the formation of a single interconnect 810, the microelectronic device 200 may include many interconnects 810 at various locations and layers within the device 200.

Figure 9:
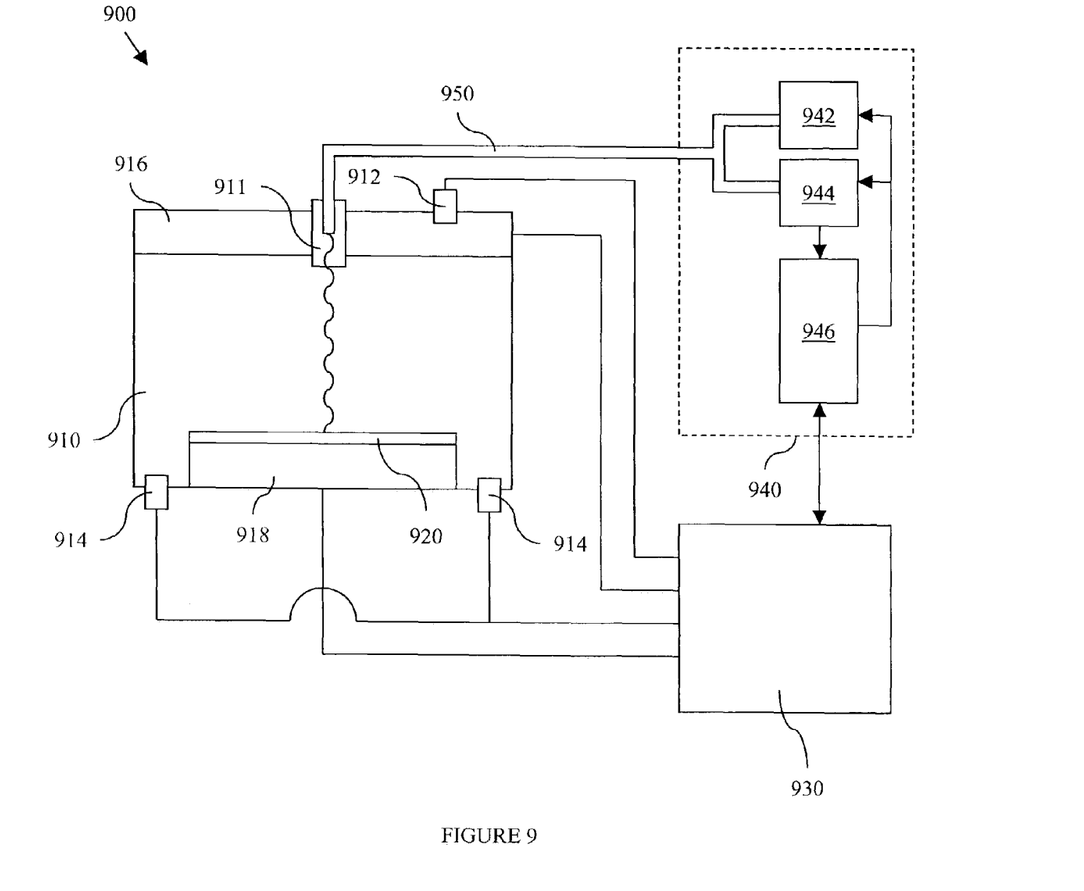
FIG. 9 illustrates a block-diagram of one embodiment of an etching system constructed according to the principles of the present disclosure.

Turning briefly to FIG. 9, illustrated is a block diagram of one embodiment of an etching system 900 for use in manufacturing a semiconductor device constructed according to the principles of the present disclosure. The system 900 may be one environment in which the method 100 shown in FIG. 1 and/or the manufacture of the microelectronic device 200 shown in FIGS. 2–8 may be implemented.

The system 900 includes a processing chamber 910 which may include an optical port 911, gas input means 912, gas output means 914, a first electrode 916 and an opposing second electrode 918. The processing chamber 910 may be suitable to run vacuum processes, such as etching, sputtering, ion implantation or chemical vapor deposition (CVD) processes. In such embodiments, the processing chamber 910 may be a vacuum chamber, and a vacuum pump (not shown) may be connected to the gas output means 914. Alternatively, the processing chamber 910 may run processes such as atmospheric pressure CVD, wherein the processing chamber 910 may be held at about atmospheric pressure, possibly with a slight vacuum.

The optical port 911 may include a window through which optical signals may pass without substantial modification, such as one comprising optical transparent glass. For example, the optical port 911 may include at least one window or view port made of a material that is transparent for the wavelength of the radiation passing therethrough and which permits an adequate illumination of the wafer 920 to produce a reflected optical signal of adequate strength. The optical port 911 may also include focusing and/or diffusing means as known to those skilled in the art.

The gas input means 912 may include fluid/gas transfer ports and/or pumps for delivering a process gas or other process reactants to the processing chamber 910. Halogens such as fluorine, chlorine and bromine are common etching gases, including those employed for plasma etching. Argon may also be delivered to the process chamber 910 to increase ion bombardment and/or for use as an actinometer to determine relative concentrations. Moreover, etching processes often call for reactive or non-reactive (inert) gas species which can be in a plasma or non-plasma state. Examples of reactive gases which can be used in the inventive system include $SiH_4$, HCl and $Cl_2$. However, any inert gas, such as $O_2$, $N_2$ or $H_2$ may also be used in the processing chamber 910. Of course, it is not intended that the present disclosure limit the etching environment to any particular composition. Effluent from the processing chamber 910 is exhausted through the gas output means 914.

The second electrode 918 may include or be incorporated in a wafer support, such that a wafer 920 being processed may rest on or be coupled to the second electrode 918 between the first and second electrodes 916, 918. The processing chamber 910 may also include other features not described or illustrated. For example, the processing chamber 910 may also include temperature control means (e.g., a heater), process gas distribution means, radio frequency coils, and the like.

The system 900 also includes a process control unit 930 electrically coupled to the gas input means 912 and gas output means 914 to control the pressure and contents of the processing chamber 910. The process control unit 930 may also be electrically coupled to the first and second electrodes 916, 918, such as for controlling electrical signals at the first and second electrodes 916, 918. For example, the process control unit 930 may provide electrical signals to the first and second electrodes 916, 918 as required for exciting the chamber contents, possibly for forming an etching or deposition plasma as known in the art. In one embodiment in which the system 900 may be employed for plasma etching or chemical vapor deposition (CVD), the signals provided by the process control unit 920 at the first and second electrodes 916, 918 may be RF signals. Of course, the present disclosure is not limited to such an embodiment.

The system 900 also includes a measurement and analysis unit 940 ("MA unit 940") electrically coupled to the process control unit 930. As such, the MA unit 940 may communicate with the process control unit 930, and may thereby trigger or control the modification of the etching process parameters based on analysis performed by the MA unit 940. The MA unit 940 is also optically coupled to the process chamber 910 by an optical fiber 950, which may comprise a fiber bundle. The MA unit 940 may include a light source 942 (such as a laser or bright white light source) coupled to the optical fiber 950 for irradiating the wafer 920. However, other irradiating means may be employed within the scope of the present disclosure, and may or may not be integral to the MA unit 940. Moreover, as discussed above, the light source 942 may not be necessary in all applications, such as when the excited plasma within the process chamber 910 provides a sufficient light source for accurately detecting optical signals reflected from the wafer 920. The light source 942 may emit one or both of a monochromatic (single wavelength) light, such as from a light-emitting diode, and polychromatic (multiple wavelength) white light.

The MA unit 940 also includes an optical signal analyzer 944 configured to receive optical signals resulting from the irradiation reflected from the wafer 920. As shown in FIG. 9, such optical signals may propagate along the optical fiber 950 between the processing chamber 910 and the optical signal analyzer 944. The optical signal analyzer 944 may be configured to perform the analysis described above with respect to the method 100 illustrated in FIG. 1, although additional or alternative analyses may be performed by the optical signal analyzer 944.

The MA unit 940 also includes a management unit 946. The management unit 946 may be coupled to the light source 942 for controlling the irradiation of the wafer 920 by the light source 942. The management unit 946 may also be coupled to the optical signal analyzer 944 to facilitate the collection and/or analysis of the optical signals reflected from the wafer 920. For example, the management unit 946 may provide data regarding layers formed on the wafer 920 to the optical signal analyzer 944 for use in the analysis performed by the optical signal analyzer 944. The management unit 946 may also receive data from the optical signal analyzer 944, such as data indicating a change in the optical characteristics of the layers being etched in the processing chamber 910. The management unit 946 may also be coupled to the process control unit 930 for assisting in the control of the etching process parameters, such as when a change in the process parameters may be modified based on a change in the characteristics of the layers being etched, as determined by the optical signal analyzer 944.

Thus, the present disclosure presents the concept of etching a multi-layer film in which the etching process may incorporate the optical characteristics of the specific layer being etched. For example, in one embodiment a wavelength of a first layer being etched is employed to monitor the progress of etching the first layer, and a wavelength of a second layer being etched is employed to monitor the progress of etching the second layer. Thus, the multi-layer film may be etched more accurately than etching processes merely employing the optical characteristics of a representative layer or an average of the optical characteristics of all of the layers.

Moreover, the etching processes described in the present disclosure may be in-situ and/or real-time processes, whether employed to monitor progress related to material removal from existing layers or to monitor the deposition of material to form multi-layer films. As such, the increased accuracy provided by the methods of the present disclosure may be attained with minimal or no impact to existing manufacturing time and costs. Furthermore, the processes of the present disclosure may be performed with existing manufacturing equipment and readily implemented into existing manufacturing procedures. The method and apparatus may also be extended to work with many etching processes, including plasma and non-plasma etching processes.

Although the present disclosure describes several embodiments in detail, those skilled in the art should understand that they can make various changes, substitutions and alterations herein without departing from the spirit and scope of the disclosure.

What is claimed is:

1. A method of continuously etching a multi-layer film, comprising the steps of:
   storing a target etch depth for each layer of a plurality of layers of said multi-layer film;
   determining the value of a selected optical characteristic for an initial layer of said plurality of layers;
   etching a layer of said plurality of layers according to selected etching parameters, said etching of each layer further comprising;
   (a) determining a plurality of values for said selected optical characteristic associated with each one of said plurality of layers-undergoing said etching,
   (b) calculating in real time the dynamic etch progressions based on said plurality of values associated with said layer undergoing said etching,
   (c) determining if one of said dynamic etch progressions is the same as said target etch depth for said layer undergoing said etching, and
   (d) repeating steps (b) and (c) until said target etch depth and said dynamic etch progressions are the same;
   determining the value of a selected optical characteristic for another layer of said plurality of layers; and
   repeating said etching step for said another layer.

2. The method as recited in claim 1 further comprising comparing said optical characteristics during the etching of a selected layer to detect differences therein and dynamically adjusting said etching parameters according to said differences.

3. The method as recited in claim 1 wherein at least two of said plurality of said optical characteristics of at least two of said layers are substantially similar.

4. The method as recited in claim 1 further comprising determining a plurality of refractive indices, one each associated with one of said plurality of layers, and wherein said dynamic etch progressions for each layer of said plurality of layers is based on one of said plurality of refractive indices that is associated with said particular one layer of said plurality of layers undergoing said etching.

5. The method as recited in claim 1 wherein said step of calculating dynamic etch progressions is further based on an elapsed etch time.

6. The method as recited in claim 1 wherein said plurality of layers includes at least three layers.

7. The method as recited in claim 1 wherein at least one of said plurality of layers comprises one selected from the group consisting of:
fluorosilicate glass;
undoped silicon glass;
phosphosilicate glass; and
silicon nitride.

8. The method as recited in claim 1 wherein said step of determining a plurality of values for said selected optical characteristic includes collecting interference signals reflected from said particular one of said plurality of layers undergoing said etching.

9. The method as recited in claim 8 wherein said step of determining a plurality of values for said selected optical characteristic includes analyzing said interference signals to determine a frequency of said associated one of said plurality of layers.

10. The method as recited in claim 9 wherein said analyzing includes performing a Fast Fourier Transform.

11. The method as recited in claim 1 wherein said etching removes portions of said plurality of layers.

* * * * *